US006933596B2

United States Patent
Hathaway et al.

(10) Patent No.: US 6,933,596 B2
(45) Date of Patent: Aug. 23, 2005

(54) ULTRA WIDEBAND BGA

(75) Inventors: James A. Hathaway, Ranchos Palos Verdes, CA (US); Brian F. Crossman, Laguna Niguel, CA (US); Salah Din, Buena Park, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 111 days.

(21) Appl. No.: 10/611,340

(22) Filed: Jul. 1, 2003

(65) Prior Publication Data

US 2005/0001296 A1 Jan. 6, 2005

(51) Int. Cl.[7] .......................... H01L 23/02; H01L 29/00
(52) U.S. Cl. ........................ 257/678; 257/531; 257/728
(58) Field of Search ............................... 257/678, 728, 257/531, 724

(56) References Cited

U.S. PATENT DOCUMENTS

| | | | |
|---|---|---|---|
| 5,023,624 A * | 6/1991 | Heckaman et al. ......... 343/860 |
| 5,191,174 A * | 3/1993 | Chang et al. ............... 174/266 |
| 5,717,245 A | 2/1998 | Pedder |
| 5,787,580 A | 8/1998 | Woo |
| 5,955,789 A | 9/1999 | Vendramin |
| 6,020,637 A | 2/2000 | Karnezos |
| 6,084,777 A | 7/2000 | Kalidas et al. |
| 6,184,477 B1 * | 2/2001 | Tanahashi ................... 174/261 |
| 6,194,669 B1 | 2/2001 | Bjorndahl et al. |
| 6,215,184 B1 | 4/2001 | Stearns et al. |
| 6,218,731 B1 | 4/2001 | Huang et al. |
| 6,242,815 B1 | 6/2001 | Hsu et al. |
| 6,301,401 B1 | 10/2001 | La |
| 6,310,386 B1 * | 10/2001 | Shenoy ....................... 257/531 |
| 6,329,606 B1 * | 12/2001 | Freyman et al. ............. 174/260 |
| 6,449,168 B1 * | 9/2002 | Soderholm .................. 361/761 |
| 6,686,882 B2 * | 2/2004 | Petros et al. ......... 343/700 MS |
| 2001/0015497 A1 | 8/2001 | Zhao et al. |
| 2001/0023782 A1 | 9/2001 | Nakamura |
| 2003/0169207 A1 * | 9/2003 | Beigel ........................ 343/718 |

* cited by examiner

*Primary Examiner*—David Nelms
*Assistant Examiner*—Long Tran
(74) *Attorney, Agent, or Firm*—John A. Miller; Warn, Hoffmann, Miller & LaLone, P.C.

(57) ABSTRACT

An electronic device packaging assembly (10) that includes a ball grid array (60) and specialized construction to be able to operate from DC up to 50 GHz with minimal parasitic losses. The packaging assembly (10) includes a thin base plate (14) made of a suitable rigid material. Power vias (48), signal vias (26) and ground vias (46) are formed through the base plate (14) to be coupled to traces, circuit components, and/or the device (12) within the packaging assembly (10). An impedance matching compensation network (28) provides impedance matching between the device (12) and the signal vias (26). The ball grid array (60) includes a plurality of solder balls (68), including ground solder balls (72), signal solder balls (74) and power solder balls (76), electrically coupled to the appropriate via extending through the base plate (14).

24 Claims, 2 Drawing Sheets

ULTRA WIDEBAND BGA

BACKGROUND OF THE INVENTION

1. Field of the Invention

This invention relates generally to an electronic device ball grid array (BGA) packaging assembly and, more particularly, to an electronic device BGA packaging assembly, including a thin laminate base plate, that is designed to operate from DC up to 50 GHz with minimal parasitic losses.

2. Discussion of the Related Art

Chip scale packaging is a known technique for environmentally protecting and configuring an electronic chip device and associated circuits within a packaging assembly. Specialized lead frames and circuit connectors are required to electrically couple the electronic device and associated circuits to the various signal lines, power lines and ground lines through the package. Existing electronic packaging assemblies sometimes include high speed input/output (I/O) ports that require costly and bulky high frequency connectors to provide the high speed.

A ball grid array (BGA) is one known I/O device that at least somewhat overcomes these disadvantages, and still provides high speed electrical connections. A BGA is a circuit connection device employing an array of solder balls mounted on a back side of a base plate of the packaging assembly. The solder balls are electrically coupled to the electronic device and associated circuits within the packaging assembly by electrical vias that extend through the base plate of the assembly. A BGA offers compact size, shortened connector lengths necessary for reducing parasitic capacitances and inductances, and good thermal contact to the package assembly for heat sink purposes. Some BGAs are constructed out of ceramic because the device package needs to be hermetically sealed. However, as the ceramic thickness increases, the thermal performance of the packaging assembly decreases.

Known BGAs are realistically limited in their performance to under certain signal speeds. Parasitic capacitances and inductances from the device packaging severely affect device performance for the known packaging assemblies above these signal speeds. In fact, most BGAs only are able to operate below 6 GHz because of their construction. U.S. Pat. No. 6,194,669 does disclose a BGA that is able to operate up to about 28 GHz.

Low cost land grid arrays (LGA) and lead-less chip carriers (LCC) are also well known electronic package construction methods that purport to operate at high frequency. However, LGAs and LCCs have the drawback of thermal cycling problems. Further, LCCs cannot be utilized for more than a certain size, which is dependant on differences between the package and circuit board material's coefficient of thermal expansion (CTE).

Another form of electronic package construction method is the leaded flatpack, which is frequently utilized for low frequency (<10 GHz) applications. For higher frequencies, the electrical leads that are formed to accommodate environmental extremes typically cause increased inductance and signal radiation, which is difficult to accommodate for.

SUMMARY OF THE INVENTION

In accordance with the teachings of the present invention, an electronic device packaging assembly is disclosed that includes a BGA and specialized construction to be able to operate from DC up to 50 GHz with minimal parasitic losses. The packaging assembly includes a thin base plate made of a specialized material, such as Rogers 4003, a liquid crystal polymer circuit board material, or other suitable thin organic laminates. An electronic device is mounted on the top surface of the base plate. Power vias, signal vias and ground vias are formed through the base plate and are coupled to traces, circuit components and/or the device within the packaging assembly. A cover is formed to the base plate to seal the components therein.

A specially configured impedance matching compensation network patterned on the base plate is coupled to each signal via. A ribbon bond is coupled to the compensation network and the device to provide impedance matching thereto. The compensation network includes an inductance stub and a capacitance stub to reduce parasitic inductive and capacitive losses. A ball is mounted to a back surface of the base plate to provide high speed electrical connections to the vias. Solder balls in the BGA have a certain size and pitch suitable for high frequency applications. The solder balls used for signal connections are separated from other solder balls in the array to form a coaxial structure.

Additional advantages and features of the present invention will become apparent from the following description and appended claims, taken in conjunction with the accompanying drawings.

DETAILED DESCRIPTION OF THE EMBODIMENTS

The following description of the embodiments of the invention directed to a high speed device packaging assembly for an electronic device including a ball grid array is merely exemplary in nature, and is in no way intended to limit the invention or its applications or uses.

Figure 1:
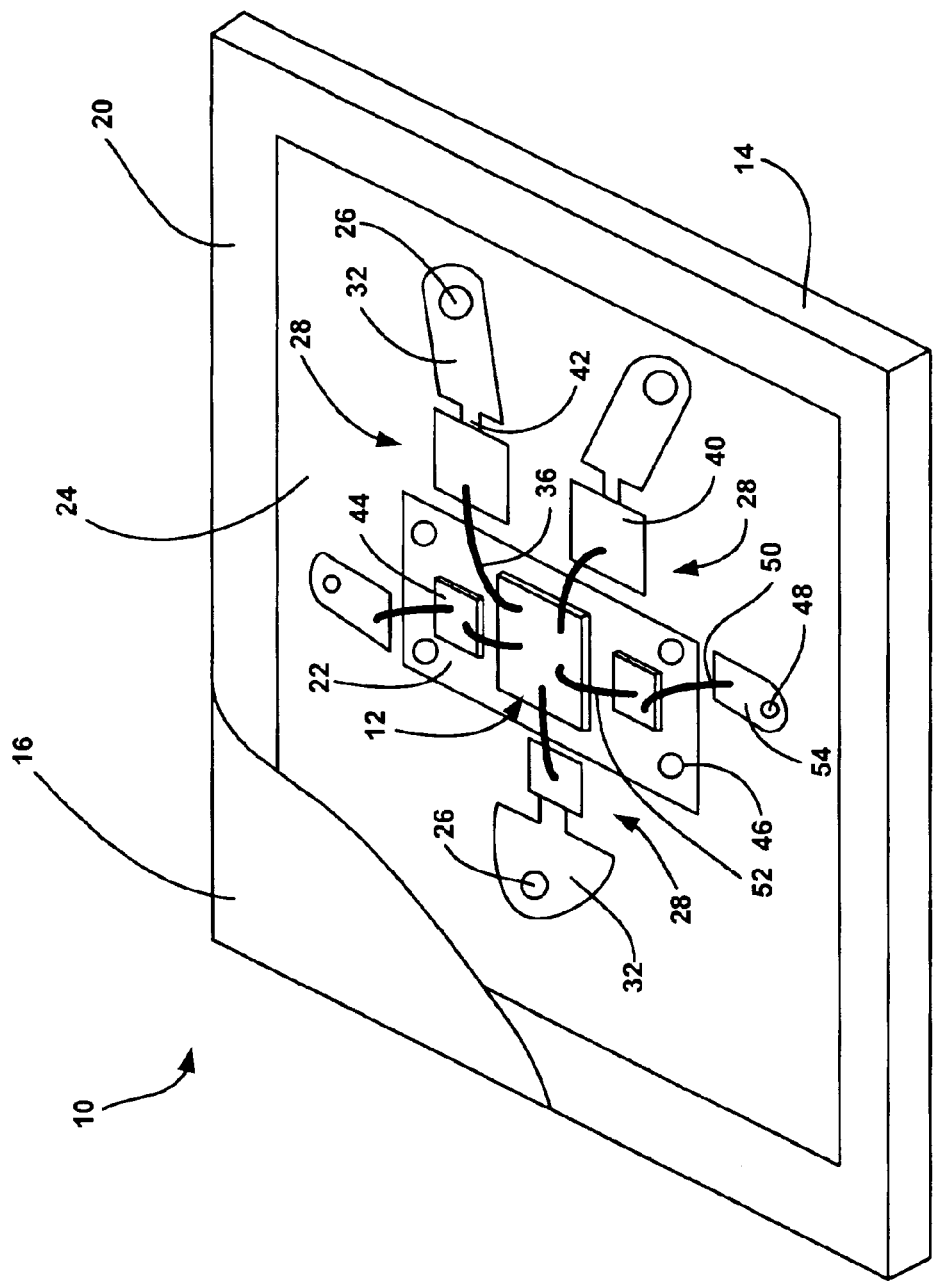
FIG. 1 is a broken-away top perspective view of a high speed device packaging assembly employing a BGA, according to an embodiment of the present invention.

FIG. 1 is a perspective view of a package assembly 10 for enclosing a high speed electronic device 12, such as an amplifier, filter, RAM, etc. The assembly 10 includes a base plate 14 to which the device 12 is mounted, as shown. The base plate 14 is made of a special laminate material, for example, a fiber and resin mixture, such as Rogers 4003, a liquid crystal polymer (LCP) circuit board material or other suitable thin organic laminates, that provide a rigid support. By using these types of materials, the base plate 14 can be made very thin, thus reducing the length of the vias and interconnections, discussed below, that would otherwise have significant drawbacks from parasitic inductances and capacitances at high signal speeds. According to one embodiment of the invention, the base plate 14 is about 0.005"–0.008" thick.

A cover 16 (shown broken away in FIG. 1) is mounted to the base plate 14 by a suitable epoxy or the like so that the device 12 is sealed therein, either hermetically or otherwise. The cover 16 can be made of any material suitable for the purposes described herein, such as plastic, metal, ceramic, etc. The base plate 14 and the cover 16 are designed to have the desired thermal conductive properties for heat sink purposes, as would be well understood to those skilled in the art.

The base plate 14 includes a ground metallization ring layer 20 deposited and formed on a top surface 24 of the base plate 14 at it's outer periphery, as shown. In an alternate embodiment, the ring layer 20 can be eliminated. The base plate 14 also includes a ground plane 22. In one embodiment, the metallization layer 20 and/or ground plane 22 is a series of layers, such as a copper layer on which is deposited a nickel layer and a gold layer to provide the appropriate electrical connections discussed herein. However, this is by way of a non-limiting example, in that the metallization layer 20 or ground plane 22 can be any conductive material suitable for the purposes described herein that can be patterned. The device 12 is mounted on the ground plane 22 formed on the top surface 24 of the base plate 14 within the ring 20 by a suitable adhesive or solder. The device 12 is interconnected to package traces and other components, discussed below, using either ribbon or wire bonds.

As would be appreciated by those skilled in the art, the top surface 24 of the assembly 10 is initially plated with the metal layers, and the various conductive traces and the like, discussed herein, including the ring layer 20 and the ground plane 22, are formed by a patterning process. Alternately, the patterning process can be a subtractive process.

Holes are drilled through the base plate 14 to accommodate the various electrical vias, discussed below, that are necessary to provide signal connections, power connections and ground connections to the device 12 and the various other circuits contained in the packaging assembly 10. The vias can be made by an electroplating process, where the vias are filled with a conducting material, such as a silver epoxy or other appropriate material, and plated to seal the via completely from the outside environment.

High speed signal vias 26 are formed through the base plate 14 for high frequency signal connections to the device 12. According to the invention, a plurality of compensation networks 28 are patterned on the top surface 24 of the base plate 14 proximate the device 12 for coupling the signals to the device 12. The compensation network 28 provides impedance matching between the vias 26 and the device 12 to minimize signal loss. Particularly, the compensation network 28 is coupled to a signal trace 32 and a wire or ribbon bond 36. Other ribbon bonds can be employed in combination with the ribbon bond 36 in other embodiments. In most applications, the signal trace 32 will be a 50 ohm trace to be compatible with the impedance of the outside electrical connections. The signal trace 32 is coupled to the via 26 and the ribbon bond 36 is coupled to the device 12. The compensation network 28 includes a capacitance stub 40 and an inductive stub 42 to provide capacitive matching and inductive matching between the device 12 and the via 26. In other words, the capacitive stub 40 and the inductive stub 42 are sized and shaped to provide the desired impedance matching between the signal trace 32 and the wire or ribbon bond 36 to minimize reflections therebetween and reduce parasitic losses.

A plurality of ground vias 46 are formed through the base plate 14 and electrically coupled to the ground plane 22 to couple the back-side metal of the device 12 to ground. A pair of optional decoupling capacitors 44 are mounted on the ground layer 22 and are electrically coupled to wire or ribbon bonds 50 that are electrically coupled to power traces 54. The power traces 54 are electrically coupled to power vias 48. The decoupling capacitors 44 are also electrically coupled to the device 12 by wire or ribbon bonds 52. Therefore, spikes in the DC power signal applied to the device 12 are filtered by the decoupling capacitors 44.

Figure 2:
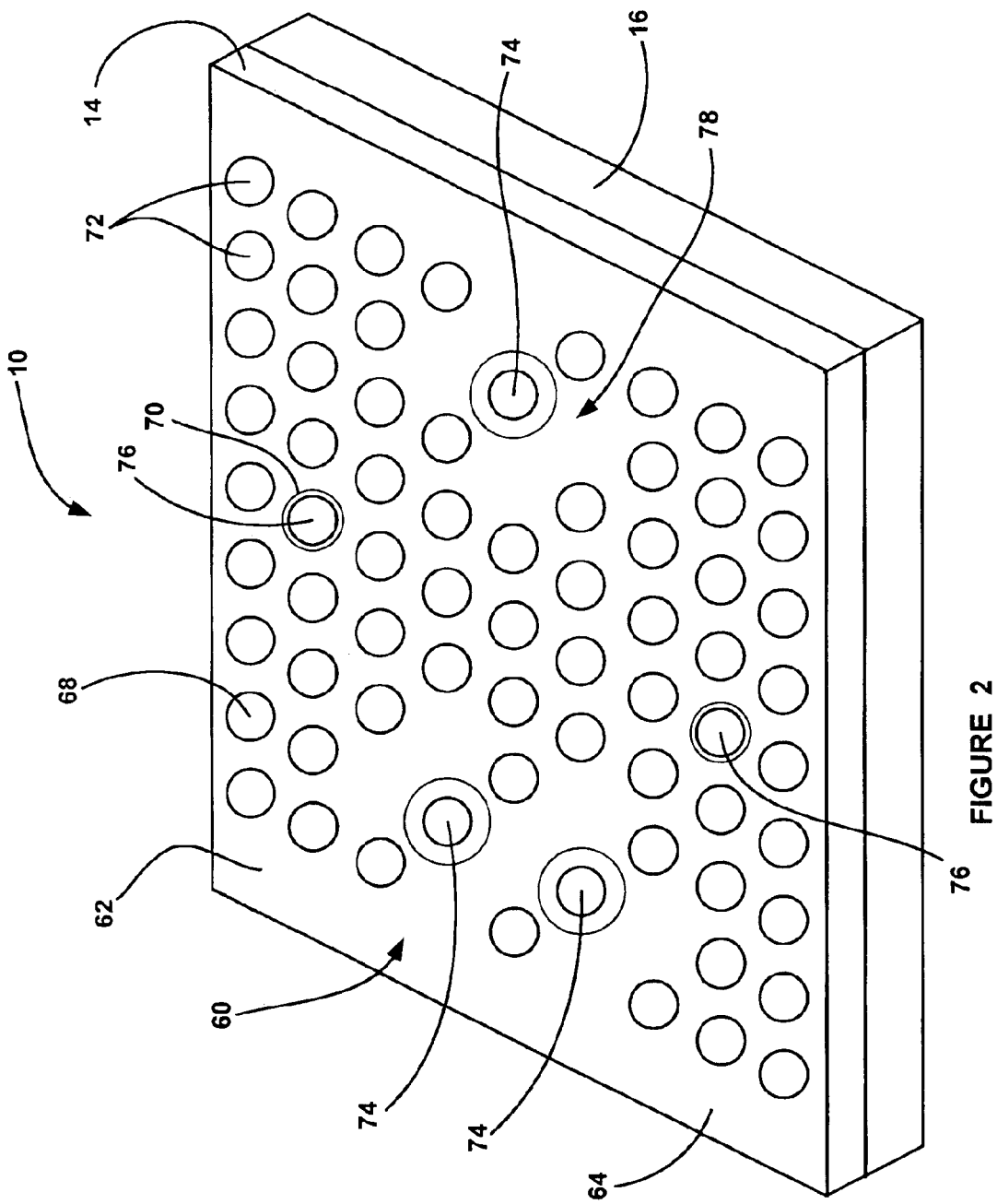
FIG. 2 is a bottom perspective view of the packaging assembly shown in FIG. 1 showing the BGA.

FIG. 2 is a bottom, perspective view of the packaging assembly 10. A BGA 60 is mounted to a bottom surface 62 of the base plate 14 by any technique suitable for the purposes discussed herein. A metallized ground plane 64 is patterned on the bottom surface 62. The various vias discussed above are electrically coupled to a particular solder ball 68 associated with the BGA 60 to provide the electrical connections to the device 12. The various solder balls 68 in the BGA 60 include ground solder balls 72, signal solder balls 74 and power solder balls 76. The solder balls 68 are also coupled to outside connectors depending on the particular application of the device 12. The BGA 60 is attached to the base plate 14 where an electrical pad is provided between the solder ball 68 and the particular via. The signal balls 74 and the power balls 76 are electrically isolated from the ground plane 64 by etched rings 70 in the ground plane 64.

The arrangement of the solder balls 68 has a certain pitch or ball spacing suitable for high speed applications. In one embodiment, the pitch is 0.03". However, this is by way of a non-limiting example in that other solder ball spacings may be applicable for other applications. Also, the solder balls 68 have a certain diameter that is suitable for high frequency applications to make the balls 68 smaller and reduce parasitic losses. In one embodiment, the solder ball diameter is about 0.018".

Solder balls around the high speed signal solder balls 74 are removed. Particularly, four of the solder balls 68 around the signal solder balls 74 that would normally be included to satisfy the ball pitch have been removed. This provides a coaxial connection for the signal solder balls 74 that acts to increase device performance. By depopulating or removing the solder balls 68 around the signal solder balls 74, the metallized ground plane 64 provides the outer coaxial around the signal solder ball 74 and the etched ring 70 around the signal solder ball 74 provides the dielectric therebetween. The discussion of this type arrangement for a ball grid array can be found in U.S. Pat. No. 6,194,669, issued Feb. 27, 2001 to Bjorndahl et al. and assigned to the Assignee of this application.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. An electronic device packaging assembly for enclosing an electronic device, said assembly comprising:

a base plate including a top surface and a bottom surface, said electronic device being mounted to the top surface of the base plate;

a plurality of electrical vias extending through the base plate, said base plate being made of a laminate material including a fiber and resin mixture and having a thickness less than 0.01";

electrical traces patterned on the top surface of the base plate and being in electrical contact with the vias in a selective manner, said traces including ground traces, signal traces and power traces, said signal traces including an impedance matching compensation network, said electronic device being electrically coupled to the compensation networks to provide impedance matching between the electronic device and the signal traces; and a ball grid array mounted to the bottom surface of the base plate, said ball grid array including a plurality of balls electrically coupled to the vias in a selective manner to provide electrical connections to the electronic device, wherein the packaging assembly allows the electronic device to effectively operate at frequencies from DC up to 50 GHz.

2. The assembly according to claim 1 wherein the base plate is made of a material selected from the group consisting of Rogers 4003 and a crystal polymer circuit board material.

3. The assembly according to claim 1 wherein the base plate has a thickness in the range of about 0.005"–0.008".

4. The assembly according to claim 1 wherein the ball grid array includes ground balls, signal balls and power balls.

5. The assembly according to claim 4 wherein the balls of the ball grid array have a predetermined ball pitch, and wherein certain of the balls around the signal balls that would satisfy the ball pitch are depopulated to make the signal balls coaxial with a ground plane patterned on the back surface of the base plate.

6. The assembly according to claim 5 wherein the ball pitch is 0.030".

7. The assembly according to claim 1 wherein the balls have a ball diameter of about 0.18".

8. The assembly according to claim 1 wherein the compensation network includes a capacitive stub and an inductive stub to provide capacitive and inductive impedance matching that reduces parasitic losses.

9. The assembly according to claim 1 further comprising a cover, said cover being mounted to the top surface of the base plate to seal the electronic device therein.

10. The assembly according to claim 9 wherein the cover is sealed to a ring trace patterned around an outer periphery of the top surface of the base plate.

11. The assembly according to claim 1 further comprising a plurality of decoupling capacitors mounted to the top surface of the base plate and being electrically coupled to the electronic device.

12. An electronic device packaging assembly comprising:
a laminate base plate including a top surface and a bottom surface, said laminate base plate being made of a material including a fiber and resin mixture and being less than 0.01" thick;
a plurality of electrical vias extending through the base plate;
electrical traces patterned on the top surface of the base plate and being in electrical contact with the vias, said traces including ground traces, signal traces and power traces;
an electronic device mounted to the top surface of the base plate on a ground trace, said electronic device being electrically coupled to the power traces and the signal traces, wherein the packaging assembly allows the electronic device to effectively operate at frequencies from DC up to 50 GHz; and
a ball grid array mounted to the bottom surface of the base plate, said ball grid array including a plurality of balls having ground balls, signal balls and power balls electrically coupled to the vias to provide electrical connections to the electronic device, said balls having a ball pitch.

13. The assembly according to claim 12 wherein the base plate is made of a material selected from the group consisting of Rogers 4003 and a crystal polymer circuit board material.

14. The assembly according to claim 12 wherein certain of the balls around the signal balls that would satisfy the ball pitch are depopulated to make the signal ball coaxial with a ground plane patterned on a back surface of the base plate.

15. The assembly according to claim 12 wherein the ball pitch is 0.030" and the balls have a diameter of about 0.18".

16. The assembly according to claim 12 wherein the signal traces include an impedance matching compensation network, said compensation network including a capacitive stub and an inductive stub to provide capacitive and inductive impedance matching that reduced parasitic losses.

17. A high speed electronic device packaging assembly for packaging an electronic device, said assembly comprising:
a base plate including a top surface and a bottom surface, said base plate being made of a laminate material including a fiber and resin mixture and being less than 0.01" thick;
a plurality of electrical vias extending through the base plate, said electrical vias including ground vias, signal vias and power vias;
electrical traces patterned on a top surface of the base plate, said traces including ground traces, signal traces and power traces, where the signal traces are electrically coupled to signal vias, the power traces are electrically coupled to power vias and the ground traces are electrically coupled to ground vias, said signal traces including an impedance matching compensation network, said electronic device being electrically coupled to the compensation network to provide impedance matching between the electronic device and the signal traces; and
a ball grid array mounted to the bottom surface of the base plate, said ball grid array including a plurality of solder balls being arranged by a certain ball pitch, said solder balls including power solder balls, signal solder balls and ground solder balls, said power solder balls being electrically coupled to power vias, said signal solder balls being electrically coupled to signal vias and said ground solder balls being electrically coupled to ground vias, wherein the packaging assembly allows the electronic device to effectively operate at frequencies from DC up to 50 GHz.

18. The assembly according to claim 17 wherein the base plate is made of a material selected from the group consisting of Rogers 4003 and a crystal polymer circuit board material.

19. The assembly according to claim 17 wherein the base plate has a thickness in the range of about 0.005"–0.008".

20. The assembly according to claim 17 wherein certain of the balls around the signal solder balls that would satisfy the ball pitch are removed to make the signal solder balls coaxial with a ground plane patterned on the back surface of the base plate.

21. The assembly according to claim 17 wherein the ball pitch is about 0.030".

22. The assembly according to claim 17 wherein the solder balls have a ball diameter of about 0.18".

23. The assembly according to claim 17 wherein the compensation network includes a capacitive stub and an inductive stub to provide capacitive and inductive impedance matching that reduces parasitic losses.

24. The assembly according to claim 17 further comprising a cover, said cover being mounted to the top surface of the base plate to seal the electronic device therein.

* * * * *